United States Patent [19]

Kosugi

[11] Patent Number: 4,823,012

[45] Date of Patent: Apr. 18, 1989

[54] STEP AND REPEAT EXPOSURE APPARATUS HAVING IMPROVED SYSTEM FOR ALIGNING

[75] Inventor: Masao Kosugi, Yokohama, Japan

[73] Assignee: Canon Kabushiki Kaisha, Tokyo, Japan

[21] Appl. No.: 69,226

[22] Filed: Jul. 2, 1987

[30] Foreign Application Priority Data

Jul. 4, 1986 [JP] Japan ................................ 61-156241

[51] Int. Cl.$^4$ .............................................. G01J 1/00
[52] U.S. Cl. ............................. 250/491.1; 250/492.2; 250/548; 356/400
[58] Field of Search .................. 250/491.1, 492.2, 548; 356/400

[56] References Cited

U.S. PATENT DOCUMENTS 4,423,959  1/1982  Nakazawa et al. .................. 356/400
4,677,301  6/1987  Tanimoto et al. ................... 250/548
4,712,016 12/1987  Matsumura .......................... 250/548

Primary Examiner—Carolyn E. Fields
Assistant Examiner—John A. Miller
Attorney, Agent, or Firm—Fitzpatrick, Cella, Harper & Scinto

[57] ABSTRACT

An alignment and exposure apparatus for aligning and exposing, in sequence, different shot areas of a semiconductor wafer with and to a pattern formed on a reticle is disclosed. The apparatus includes an alignment system having at least one objective optical system for detecting, at the same time, alignment marks provided in association with neighboring shot areas of the wafer which are to be exposed to the reticle pattern in sequence. Thus, with a simple structure and without the necessity of excessive movement of the wafer, signals providing sufficient positional information necessary for aligning each shot area with the reticle pattern are obtainable. This assures improved throughput and improved alignment accuracy.

12 Claims, 4 Drawing Sheets

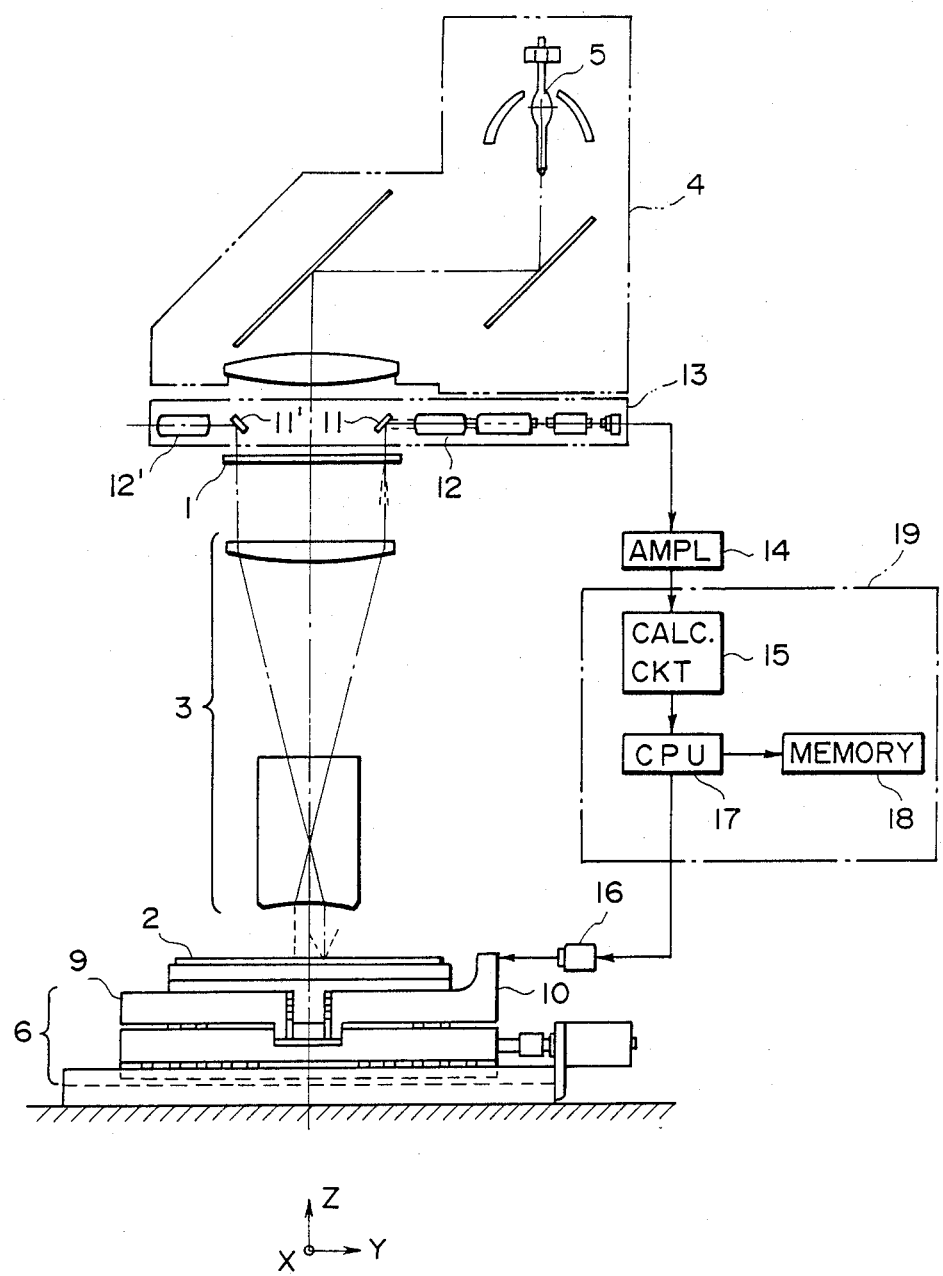
F I G. 1

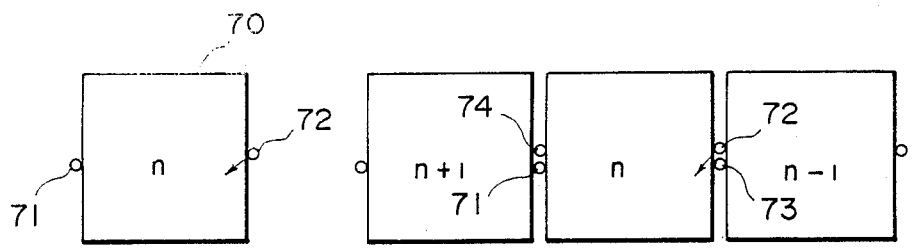
FIG. 4A   FIG. 4B
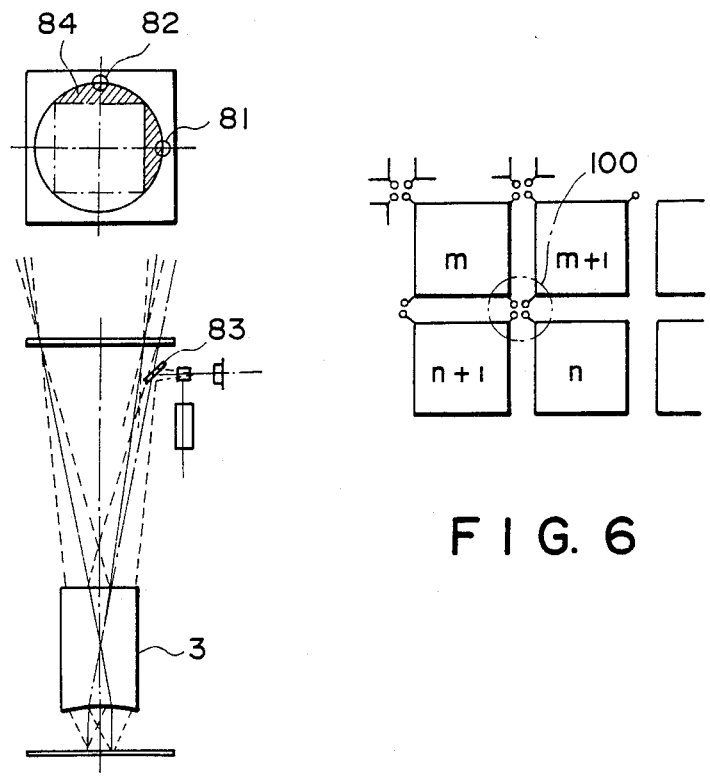
FIG. 5
FIG. 6

STEP AND REPEAT EXPOSURE APPARATUS HAVING IMPROVED SYSTEM FOR ALIGNING

FIELD OF THE INVENTION AND RELATED ART

This invention relates generally to an exposure apparatus usable in a photolithography process which is one of the processes for manufacturing semiconductor devices such as integrated circuits, large scaled integrated circuits, etc.

Particularly, the invention is concerned with a step-and-repeat type exposure apparatus, called "stepper", for repeatedly exposing a semiconductor substrate (wafer) to a pattern formed on a reticle or a mask with radiation such as a light or X-rays while moving the wafer stepwise. More particularly, the invention is concerned with an alignment detecting system usable in such a stepper and operable for aligning the pattern of the reticle or mask with a pattern formed on the semiconductor substrate, as well as a technique for matching such an alignment detecting system with the repeated procedure of the alignment and exposure.

The trend of acquiring high-speed response and high-degree integration of the semiconductor devices such as integrated circuits has forced further improvements in the performance of aligners (semiconductor device manufacturing alignment and exposure apparatuses). At present, reduction projection type step-and-repeat optical exposure apparatuses are prevalent as the aligners for the manufacture of semiconductor devices. In the future, X-ray aligners having finer resolution will be prevailingly used. As for such X-ray aligners, also, stepper type exposure apparatuses usable with a mask, having a pattern region of an area smaller than the surface area of a wafer, and being operable to repeatedly expose the wafer to the mask pattern will be desirable.

Basically, the alignment and exposure apparatus (called "aligners") include two functional components, namely, (i) an exposure system for printing the pattern of the mask upon the wafer and (ii) an alignment system for relatively aligning the mask pattern and a pattern having been printed on the wafer. Also, the stepper type aligners are additionally provided with a shot arraying function that includes an X-Y stage capable of moving the wafer in an X-Y coordinate system at a high speed and with high precision.

Moreover, a variety of additional functions are required in the aligners in order to improve the productivity and also to improve the performance of the semiconductor devices themselves. For example, in the stepper type aligners, an automatic reticle changing function for the full automatization purpose, a reticle inspecting function for increasing the yield, and an environmental condition monitoring function or a self-diagnosing function for improving the operation rate are desired. Further, it is desired to provide the stepper with a bar-code reader for reading a bar code on a reticle or a wafer for the process control purpose or to arrange the stepper so as to meet the in-line or on-line systematization for the centralized process control purpose. It is additionally desired to construct the stepper so as to meet the introduction of conveying robots for the factory automatization purpose or the fully unmanned operation purpose. With such escalated extension of the function, the stepper now consists of a bulky system. As a consequence, the manufacturing cost of the stepper is increasing more and more.

SUMMARY OF THE INVENTION

It is accordingly a primary object of the present invention to provide a step-and-repeat type alignment and exposure apparatus and method which assures an improved alignment accuracy without increasing the manufacturing cost of the apparatus.

It is another object of the present invention to provide a software and a hardware for an alignment and exposure apparatus, by which a desired performance is assured with a decreased number of elements.

It is a further object of the present invention to provide a method and apparatus, for a stepper type aligner having an alignment detecting system and a wafer stage with a high positioning accuracy, by which the alignment detecting system and the high-precision wafer stage are organically combined to improve the alignment accuracy.

It is yet another object of the present invention to provide a method and apparatus, for a stepper type aligner, by which a desired alignment accuracy is assured with use of a simple alignment detecting system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a step-and-repeat type alignment and exposure apparatus according to one embodiment of the present invention.

FIGS. 4A and 4B are principle views, respectively, for explicating the manner of discrimination of extraordinariness of the alignment mark signal.

FIG. 5 is a schematic view of a step-and-repeat type alignment and exposure apparatus having a conventional type alignment system.

FIG. 6 shows another example of the manner of provision of alignment marks on a wafer, in accordance with another embodiment of the present invention.

DESCRIPTION OF THE PREFERRED EMBODIMENTS

Figure 2A:
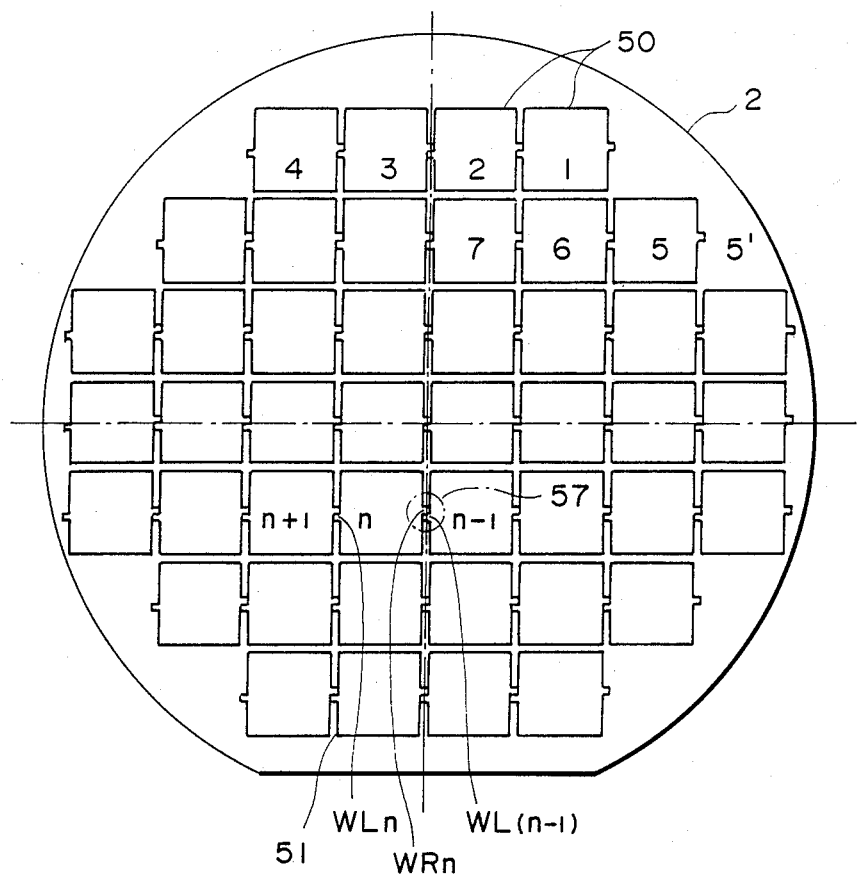
FIG. 2A is a plan view of a wafer, for schematically showing an example of the layout of shot areas on the wafer and the manner of provision of alignment marks on the wafer.

Referring first to FIG. 1, there is shown a major portion of a systematic arrangement of a step-and-repeat type alignment and exposure apparatus according to one embodiment of the present invention. The arrangement as depicted in the illustration of FIG. 1, itself, may be similar to that disclosed in U.S. Pat. No. 4,521,082 assigned to the same assignee of the subject application and corresponding to Japanese Laid-Open Patent Application, Laid-Open No. 25638/1983.

In FIG. 1, a pattern formed on a reticle 1, as illuminated by an illumination optical system 4 including a lamp 5, is projected and imaged upon the surface of a wafer 2 by means of a projection lens system 3. The wafer 2 is placed on an X-Y stage 6. With the aid of the movement of the stage 6 in the X and Y directions, images of the pattern of the reticle 1 are projected and photoprinted upon substantially the whole surface of the wafer 2 in the step-and-repeat manner.

The position of the stage 6 and, therefore, the position of the wafer 2 can be measured or monitored with a certain resolution, e.g., of an order of 0.02 micron by projecting a laser beam from a laser interferometer measuring unit 16 upon a flat mirror portion 10 which is provided at an end of an X-Y table 9 that constitutes a portion of the X-Y stage 6.

An alignment detecting system 13 is disposed above the reticle 1 and comprises a binocular microscope system including two objective mirrors 11 and 11' and two objective lenses 12 and 12'. By use of two viewfields of the binocular microscope system, two alignment mark forming regions on the reticle 1 and two alignment mark forming regions on the wafer 2 can be observed simultaneously. As seen from FIG. 1, the alignment mark forming regions on the wafer 2 are observed by the microscope system and through or by way of the projection lens system 3. In the alignment mark forming regions of the reticle and the wafer, alignment marks are formed as will be described later in detail.

A light from each alignment mark and bearing positional information concerning the alignment mark is photoelectrically converted within the alignment detecting system 13 into an electric signal which, in turn, is amplified by an amplifier 14. A control unit 19 includes a calculating circuit 15 which is arranged to process electric signals, supplied from the amplifier 14, in a well-known signal processing manner and to detect and output error components ($X_{Ln}$, $Y_{Ln}$, $X_{Rn}$ and $Y_{Rn}$) with respect to the X and Y directions in accordance with the output signals from the amplifier 14. Here, the suffix "n" denotes that the data is concerned with the "n-th" one of plural shot areas defined on the wafer. Also, the suffix "L" or "R" denotes that the data is concerned with the left-hand side one or the right-hand side one of two alignment marks provided for each shot area on the wafer. For example, the reference "$X_{Ln}$" denotes the error component, in the X direction, of the position of the left-hand side alignment mark of the "n-th" shot area of the wafer.

The calculating circuit 15 is further operable to resolve the outputted errors $X_{Ln}$, $Y_{Ln}$, $X_{Rn}$ and $Y_{Rn}$ into positional error components $\Delta X$ (in the X direction), $\Delta Y$ (in the Y direction) and $\Delta \theta$ (in the $\theta$ or rotational direction) and a magnification error $\Delta \beta$ (runout $\beta$), all of which are concerned with the shot area "n". These data are obtained in accordance with Equation (1) set forth below and are supplied to a central processing unit 17 (hereinafter simply "CPU").

$$\Delta X = (X_{Ln} + X_{Rn})/2$$

$$\Delta Y = (Y_{Ln} + Y_{Rn})/2$$

$$\Delta \theta = (Y_{Ln} - Y_{Rn})/2$$

$$\Delta \beta = (X_{Ln} - X_{Rn})2 \qquad (1)$$

The CPU 17 supplies a driving signal to an alignment driving means, not shown, so as to correct the relative position of the reticle 1 and the wafer 2 with respect to these directions. For example, the X-Y stage 6 is moved for the position adjustment purpose. After completion of the alignment, the exposure operation is initiated.

FIG. 2A shows an example of the layout of shot areas defined on the wafer 2. For convenience, shot numbers 1, 2, 3, ..., n−1, n, n+1, ... are assigned to the shot areas in an order corresponding to the sequence of "exposures" of these shot areas.

Figure 2B:
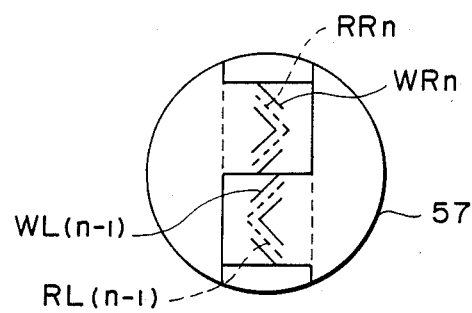
FIG. 2B schematically shows an image as observable through an alignment detecting system arranged in accordance with the present invention.

Each shot area has alignment marks $W_{Ln}$ and $W_{Rn}$ which are placed on the left-hand and right-hand sides of the shot area, respectively. These alignment marks were formed at the same time as the "exposure" of the corresponding shot area during the preceding photoprinting process. Usually, these wafer alignment marks are provided on scribe lines 51. As a matter of consequence, an alignment mark of one of two successive shot areas and an alignment mark of the other of the two successive shot areas are so formed on the same scribe line, extending vertically as viewed in FIG. 2A, that the marks are juxtaposed with each other in the vertical direction as viewed in FIG. 2A, and as is best seen in FIG. 2B. In FIG. 2B, the wafer alignment marks are depicted by solid lines. On the other hand, broken lines $R_{Rn}$ and $R_{L(n-1)}$ denote images of reticle alignment marks, as projected upon the wafer.

One of the most important features of the present invention resides in that, in the FIG. 1 embodiment, each of the objective lenses 12 and 12' of the alignment detecting system 13 is set so as to have a viewfield, such as illustrated at 57 in FIG. 2B, that allows simultaneous observation of both (i) one of the left-hand and right-hand sides wafer alignment marks of a current shot area (the shot area which is going to be exposed to the reticle pattern) and (ii) one of the wafer alignment marks of an adjacent shot area, as well as corresponding reticle alignment marks. Thus, when the "n-th" shot area is the "current shot area", the objective lenses 12 and 12' are operable to observe the wafer alignment marks $W_{Ln}$ and $W_{Rn}$ of the current shot area "n", as well as the left-hand side wafer alignment mark $W_{L(n-1)}$ of an adjacent shot area of the number "n−1" and the right-hand side alignment mark of an adjacent shot area of the number "n+1", as will be understood from FIG. 2A. Also, in connection with this feature of the present invention, the calculating circuit 15 operates to calculate, on the basis of detection signals obtained as a result of observation of these wafer alignment marks and reticle alignment marks by the alignment detecting system 13, positional errors of the alignment marks of the current shot area (the shot area "n") and the alignment marks of the adjacent shot areas (the shot area "n−1" and the shot area "n+1"). The thus detected positional errors of the alignment marks are inputted into the CPU 17.

Namely, in the alignment system of the FIG. 1 embodiment having a pair of objective lenses (12 and 12'), the calculating circuit 15 produces, in relation to the position detection with respect to the n-th shot area, data of positional errors $X_{Ln}$, $Y_{Ln}$, $X_{Rn}$, $Y_{Rn}$, $X_{N(n-1)}$, $Y_{N(n-1)}$, $X_{N(n+1)}$ and $Y_{N(n+1)}$. The suffix "N(n−1)" denotes that the data is concerned with the positional error related to the wafer alignment mark of the shot area of the number "n−1" as observed when the wafer is at a position for the alignment detection with respect to the n-th shot area. Also, the suffix "N(n+1)" denotes that the data is concerned with the positional error of the alignment mark of the shot area of the number "n+1".

Figure 3:
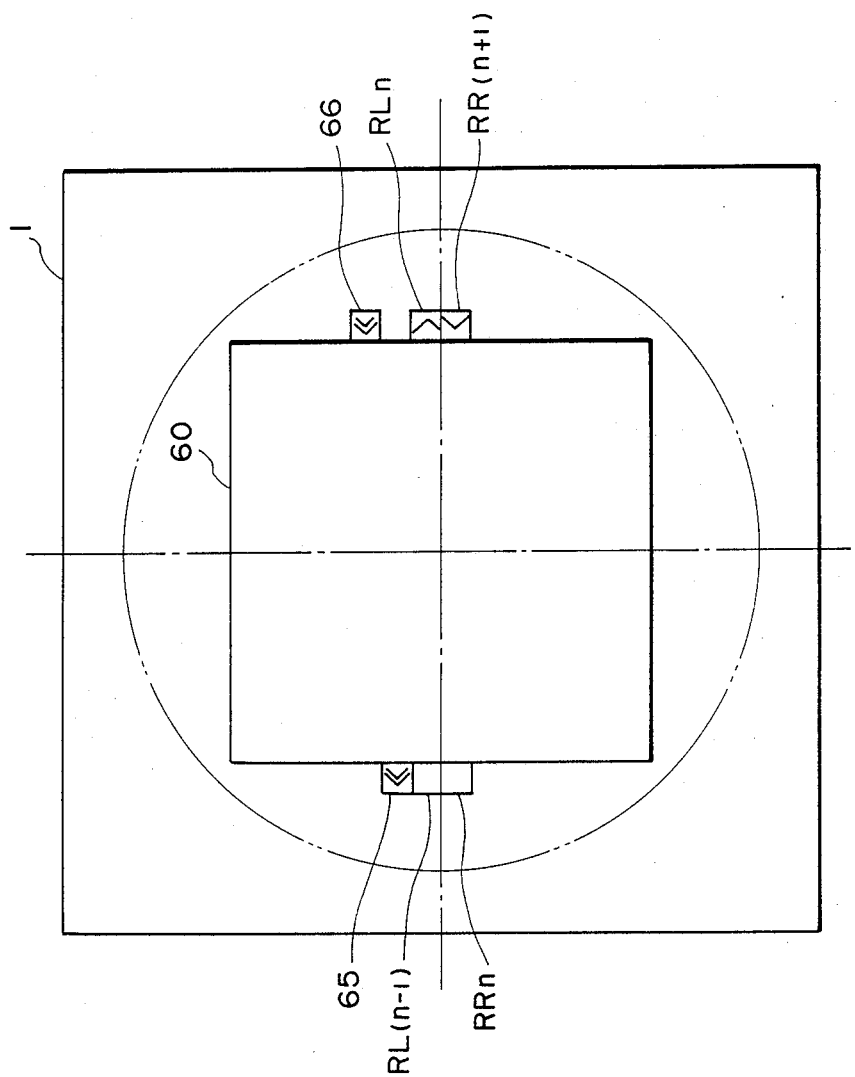
FIG. 3 schematically shows a reticle usable in the FIG. 1 apparatus and having a circuit pattern and alignment marks.

FIG. 3 shows an example of a reticle which is usable for such wafer alignment as described above. In FIG. 3, the reticle 1 has a pattern forming region 60 in which an actual device pattern is formed. Reticle marks are formed in mark forming regions defined on the left-hand and right-hand sides of the region 60. Of these marks, those denoted at $R_{Rn}$ and $R_{Ln}$ are the reticle alignment marks which correspond to the wafer alignment marks of the current shot area, such as at $W_{Rn}$ and $W_{Ln}$ shown in FIGS. 2A and 2B. Also, denoted at $R_{L(n-1)}$ and $R_{R(n+1)}$ are the reticle alignment marks corresponding to two wafer alignment marks of the adjacent shot areas which marks may be denoted at $W_{L(n-1)}$ and $W_{R(n+1)}$. Denoted at 65 and 66 in FIG. 3 are alignment marks which are to be photoprinted on the wafer during the subsequent exposure operation, so as to form on the current shot area the wafer alignment marks that are to be used for the next alignment operation of the same shot area.

Next, description will be made of further features of the present invention.

Feature 1

In this feature, the present invention allows discrimination of the extraordinariness of the result of mark detection. According to the prior art technique and in relation to the detection of left and right alignment marks 71 and 72 (FIG. 4A) of a current shot area 70, if the detected positional data includes any extraordinariness (as symbolically illustrated by an arrow of vector) which might be caused by the damage of the mark or the like, it is not possible to discriminate whether the extraordinariness is related to the left-hand alignment mark or the right-hand alignment mark. In accordance with the present invention, as compared therewith, the alignment marks 71 and 72 of the current shot area as well as two alignment marks 73 and 74 of two shot areas, adjacent to the current shot area, are observed. If only the data concerning the mark 72 is extraordinary so that the remaining data concerning the marks 71, 73 and 74 are ordinary, then the ratio of the ordinary data versus the extraordinary data is 3:1. Thus, the positional data concerning the mark 72, which is the minor data, is discriminated in the control unit 19 (FIG. 1) as being extraordinary. Then, the reticle-to-wafer alignment with regard to the current shot area is executed in accordance with the positional information concerning the mark 71 only or the positional information concerning the marks 71 and 73. In this manner, the misalignment of the current shot area 70 or "n" can be effectively avoided.

Feature 2

In the FIG. 1 embodiment, each of the juxtaposed wafer alignment marks is detected twice, interruptedly, by means of the binocular detecting system having two objective lenses 12 and 12'. For example, the alignment marks $W_{Rn}$ and $W_{L(n-1)}$ shown in FIG. 2A are observed and detected by use of the objective lens 12 at the time of the alignment detection for the shot area of the number "n−1". On the other hand, at the time of alignment detection for the "n-th" shot area, the positions of these marks are measured again by use of the other objective lens 12' of the detecting system 13.

In a case where each mark is formed by bar-like mark elements such as illustrated in FIG. 2B, the interval or spacing between such mark elements, formed on the same substrate in close proximity to each other, of each of different marks provided on the same substrate can be considered as being constant in the light of the required alignment accuracy. Also, the width of each mark element can be considered as being substantially constant. Accordingly, by monitoring the read-out values of the two objective systems (having the objective lenses) with respect to the same mark, it is possible to discriminate which one of the detected values obtained through the two objective systems is extraordinary, if any. For example, the extraordinariness of the objective system having the objective lens 12 or of the objective system having the objective lens 12' can be detected by monitoring, by use of the control system 19 shown in FIG. 1, any change or difference in the read-out values of the two objective systems concerning the interval of the mark elements of the same mark, such as, for example, the mark $W_{Rn}$.

Feature 3

The alignment process wherein the reticle-to-wafer alignment is carried out with regard to each of the shot areas on the wafer is called "die-by-die alignment process". While a very high alignment accuracy is attainable with this alignment process, it is not easy to improve the throughput. Higher throughput itself is attainable by a global alignment process wherein the alignment operation is executed once, in principle, for one wafer, or a zone alignment process wherein the alignment operation is executed for each zone of the wafer surface, each zone including plural shot areas. According to the latter alignment processes, the wafer is moved stepwise for the sequential exposures while chiefly relying upon the step-feeding accuracy of the X-Y stage whose position is monitored by a laser interferometer measuring unit such as at 16 in FIG. 1. Therefore, if the wafer has a shot layout error (called "process error") resulting from the inherent characteristics of the exposure apparatus used at the preceding photoprinting process or caused as a consequence of the heat treatment, the etching operation and the like, there will occur a superimposition error, i.e. an error in superimposing the reticle pattern upon the pattern already photoprinted on the wafer. Such error can be corrected by controlling the amount of step-feeding in accordance with a shot layout map or on the basis of a co-ordinate system transforming function, both of which can be prepared by the control unit 19 of the FIG. 1 apparatus from the positional information obtained as a result of measurement of the positional deviations with regard to a plurality of predetermined sampling shot areas on the wafer. In accordance with the present invention, the measurement with regard to one shot area permits simultaneous detection of positional information concerning the positional errors of a current shot area and an adjacent shot area or areas. Therefore, with the same sampling number, it is possible to obtain a larger amount of positional information, which directly leads to the improvement of the precision of calculation of the amount of correction for the amount of step-feeding of the wafer stage. Alternatively, the sampling number may be reduced but to retain substantially the same amount of positional information as attainable without the present invention. By doing so, the throughput can be improved while retaining substantially the same pattern superimposition accuracy.

Feature 4

While the FIG. 1 embodiment uses a binocular alignment detecting system 13 having two objective systems, the invention is not limited to this. Namely, one of the two objective systems (e.g. one including the elements 11' and 12') may be omitted. In such case, because of a single objective system, it is not possible with the prior art technique to detect the rotational error $\Delta\theta$ and the magnification error $\Delta\beta$. Alternatively, the throughput is reduced. Namely, from the data concerning the positional error with regard to a single point on the wafer, it is not possible to detect the rotational error $\Delta\theta$ and the magnification error $\Delta\beta$. If, on the other hand, in order to detect the rotational error $\Delta\theta$ and the magnification error with use of the single objective system, it is $\Delta\beta$ necessary to move the wafer, for each shot area, by three-step feeding such as, for example, by moving the wafer to the left-hand alignment mark detecting position, to the right-hand alignment mark detecting position and finally to the exposure position. This prolongates the processing time to a large extent.

Such inconveniences as described above are obviated in the alignment detection by use of a single objective system according to the present invention. For the detection of the rotational error $\Delta\theta$ and the magnification error $\Delta\beta$, it is effective to use the laser interferometer measuring system 16 that can measure the position of the X-Y stage 6 very precisely. For example, in relation to the wafer alignment with regard to the n-th shot area, the detected values $X_{N(n-1)}$ and $Y_{N(n-1)}$ obtained as a result of the measurement with regard to the preceding shot area of the number "n−1" and the coordinate positions $x_{n-1}$ and $y_{n-1}$ of the wafer stage measured at the same time by the laser interferometer system 16, are stored into the memory 18. After the wafer is moved to move the n-th shot area to the alignment detecting position, the positional data $X_{Ln}$ and $Y_{Ln}$ concerning the n-th shot area is detected. Also, at the same time, the coordinate positions $x_n$ and $y_n$ of the wafer stage are measured by use of the laser interferometer system 16. It will be readily understood that, by use of all the data obtained with regard to the n-th shot area and the data having been stored in the memory 18, the errors $\Delta X$, $\Delta Y$, $\Delta\theta$ and $\Delta\beta$ can be easily calculated. From this example, it is seen that the positional deviation with regard to the X, Y, $\theta$ and $\beta$ components is detectable on the basis of the X-Y error detection by use of the single objective system, without deteriorating the throughput of the apparatus. Accordingly, the alignment detecting system can be made simple and compact without adverse effects.

Feature 5

The alignment system of the FIG. 1 embodiment uses, for the alignment purpose, the light of the same wavelength as the light supplied from the illumination system 4 for the photoprinting purpose. In a case, however, where the resist material applied to the wafer 2 contains a photoprinting-wavelength absorbing agent or where the resist coating provided on the wafer 2 is formed by a multilayer type photoresist film, it is preferable to use, for the alignment purpose, a light of a wavelength different from the photoprinting wavelength. While many proposals have been made in relation to alignment systems using a non-photoprinting wavelength, an example is disclosed in Japanese Laid-Open Patent Application, Laid-Open No. 130742/1985. FIG. 5 shows an alignment system of the type disclosed in this Japanese Patent Application.

The alignment system shown in FIG. 5 involves inconveniences such as follows:

(1) Because of the difficulties in fully correcting chromatic aberrations caused by the passage of the light of the non-photoprinting wavelength through the projection lens system 3, the system is arranged to detect, with each objective system, the error component only in one direction (the X direction or the Y direction). Therefore, in spite of using binocular microscope system having two objective lenses 81 and 82, the alignment system can detect only a pair of positional errors in the X and Y directions.

(2) Since the mirror 83 is fixedly provided in the path of the light from the exposure light source, the effective image field 84 of the projection lens system is substantially eclipsed, such as depicted by hatched portions.

(3) Since the optical axes of the objective lenses 81 and 82 are fixed, it is necessary to move an X-Y stage, during one exposure cycle for one shot area of the wafer, by three-step feeding so as to move (i) for the Y-axis alignment at the observation position of the objective lens 81, (ii) for the X-axis direction alignment at the observation position of the objective lens 82 and (iii) for the exposure of that one shot area. Therefore, the throughput is deteriorated remarkably.

An alignment system using a single objective system but allowing detection of positional errors in the X and Y directions, while completely correcting the chromatic aberrations caused in relation to the alignment light of the non-photoprinting wavelength, is disclosed in U.S. Patent application, entitled "An Observation System for a Projection Exposure Apparatus", filed May 27, 1987 and assigned to the same assignee of the subject application. However, in order to detect the positional errors with regard to the X, Y, $\theta$ and $\beta$ components by use of the disclosed alignment system, it is still necessary to use two objective systems. Also, there is a possibility of partial eclipse of the effective image field. Further, plural stepwise movements will be necessary during one exposure cycle, resulting in a decreased throughput.

From the foregoing, it is seen that:

(a) Use of a smaller number of objective lenses is preferable in respect to the manufacturing cost and the eclipse of the effective image field.

(b) Although a larger amount of information is detectable by moving the X-Y stage so as to bring each of the alignment marks formed at different positions on the wafer into the observation field of the objective lens, it directly deteriorates the throughput. The solution of this problem is desirable.

(c) It is desirable to obtain much information through each objective lens (detecting system).

On the other hand, the step-and-repeat type alignment and exposure apparatus (stepper) has the following fundamental features.

(i) The operation of the stepper is constituted by the repetition of the stepwise movement, the alignment step and the exposure step.

(ii) The amount of stepwise movement or step feeding is monitored precisely by a laser interferometer measuring system.

(iii) On a scribe line disposed at the boundary between two adjacent shot areas to be exposed in sequence, alignment marks for these shot areas can be formed in close proximity to each other.

Considering the above-described points (a)–(c) in connection with the three features (i)–(iii), it is readily understood that the above-described essential feature of the present invention of "simultaneous observation of alignment marks of adjacent shot areas" constitutes the effective measures for satisfying the desires (a)–(c).

When the present invention is applied to the alignment system of the type disclosed in Japanese Laid-Open Patent Application, Laid-Open No. 130742/1985, only providing alignment marks on the left and right sides of each shot area of the wafer does allow detection of the rotational positional error $\Delta\theta$ without making sacrifices such as the deterioration of the throughput, the addition of hardware (functional components), the increase in the manufacturing cost, etc. Also, where it is desired to detect only the positional errors in the X and Y directions, two-step movement is sufficient in place of the three-step movement. Thus, the throughput can be improved. When, on the other hand, the present invention is applied to an alignment system of the type disclosed in the aforementioned U.S. Patent application, use of the single objective system in combination with the alignment mark arrangement as illustrated in FIG. 2A does allow detection of the errors in the X, Y, $\theta$ and $\beta$ components in the manner as has been described with reference to the "Feature 4". It will be understood that the substitution of a single objective system for the binocular objective system is effective to reduce the manufacturing cost of the mark detecting system, approximately to the half, and also to reduce the degree of eclipse of the effective exposure range approximately to the half.

As for the concentrated disposition of alignment marks of adjacent shot areas, it is most effective to concentratingly provide these alignment marks at a corner of the shot area, such as schematically illustrated in FIG. 6. In the example of FIG. 6, alignment marks of four adjacent shot areas can be observed through the viewfield 100 of a single objective lens.

The advantageous effects of the introduction of the concept of "simultaneous observation of alignment marks of adjacent shot areas" into a stepper type exposure apparatus having an alignment detecting system and a high-precision X-Y stage, can be summarized as follows:

(A) For retaining the same accuracy as attainable with the prior art:

(1) The number of the alignment detecting systems and, therefore, the manufacturing cost of the alignment system can be reduced.

(2) As a consequence of the decrease in the number of the alignment detecting systems, the effective image field of the projection lens system can be enlarged substantially.

(3) The throughput can be improved.

(B) When the functional elements (hardware) similar to those used in the conventional alignment systems are used, the amount of detectable positional information increases so that the superimposition accuracy can be improved in the following points:

(1) For the superimposition, the positional error can be detected in an increased number of directions, without deteriorating the throughput. Namely, in an alignment system that can detect only the X and Y components without use of the present invention, use of the present invention permits the detection of the $\theta$ components in addition to the X and Y components. Further, in an alignment system that can detect the X, Y and $\theta$ components without the present invention, use of the present invention permits detection of the $\beta$ component additionally.

(2) Any extraordinary data in the results of detection, due to the damage of the mark or the existence of any foreign particle, can be excluded.

(3) The error in the alignment detecting system itself is detectable.

(4) By use of the averaging effect of the excess data, the variation in the alignment error can be suppressed. Namely, in the present invention, the position detection for one alignment mark is executed by plural times. By using the measured values obtained as a result of such plural-time detection, the measurement error can be averaged so that the variation in the alignment error can be suppressed. Also, when the present invention is applied to an alignment system wherein the mark detection for each shot area is executed by plural times and the results of detection are averaged, it is possible to decrease the number of the detecting operations and thereby to improve the throughput.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus for sequentially exposing different portions of a workpiece to a pattern formed on a mask while moving the workpiece, said apparatus comprising:

detecting means operable to detect, substantially at the same time and by use of a common objective lens, alignment marks provided in association with at least two portions of the workpiece and for producing signals corresponding to the alignment marks of said portions; and control means for controlling a relative position of each of said portions of the workpiece with respect to the mask in accordance with the signals produced by said detecting means.

2. An apparatus according to claim 1, wherein said detecting means is operable to detect alignment marks provided on the workpiece in proximity to each other.

3. An apparatus according to claim 1, further comprising a projection optical system for projecting a pattern of the mask to each of the portions, wherein said detecting means detects the alignment marks with the use of said projection optical system and the objective lens.

4. An apparatus according to claim 1, wherein said detecting means detects the alignment marks formed on a scribe line extending between the at least two portions.

5. An apparatus according to claim 4, wherein said detecting means detects each of the alignment marks, while holding constant a position of the workpiece relative to the objective lens.

6. An apparatus according to claim 1, wherein said detecting means includes means for scanning each of the alignment marks with a laser beam to detect the alignment marks.

7. An apparatus according to claim 1, wherein said detecting means includes means for scanning each of the alignment marks with a laser.

8. A device for aligning, in sequence, different portions of an object with respect to a predetermined reference by use of alignment marks provided in association with the different portions, said device comprising:
an objective lens;
means for detecting alignment marks of neighboring portions of the object through said objective lens substantially at the same time, said detecting means being operable to produce mark signals corresponding to the detected alignment marks; and
means for processing the mark signals produced by said detecting means so as to align one of the neighboring portions of the object with respect to the predetermined reference.

9. A device according to claim 8, wherein each of the alignment marks includes a first and second mark component, said first mark component being disposed on one side of a corresponding portion of the object and said second mark component being disposed on the other side of the corresponding portion of the object and wherein said detecting means is operable to detect, at the same time, a first mark component of one of the neighboring portions and a second mark component of the other one of the neighboring portions by use of said objective lens, said first mark component and said second mark component of the neighboring portions being located between the neighboring portions.

10. An apparatus according to claim 8, wherein said detecting means detects each of the alignment marks formed in a boundary between the neighboring portions.

11. An apparatus according to claim 10, wherein said detecting means detects each of the alignment marks, while holding constant a position of the object relative to the objective lens.

12. an apparatus according to claim 8, further comprising second detecting means for detecting each of the alignment marks for the neighboring portions substantially at the same time through an objective lens different from the aforementioned objective lens, and for producing mark signals corresponding to the detected alignment marks.

* * * * *

UNITED STATES PATENT AND TRADEMARK OFFICE
CERTIFICATE OF CORRECTION

PATENT NO. : 4,823,012

DATED : April 18, 1989

INVENTOR(S) : MASAO KOSUGI

It is certified that error appears in the above-identified patent and that said Letters Patent is hereby corrected as shown below:

COLUMN 3

Line 63, "$\Delta\beta=(X_{Ln}-X_{Rn})2$" should read --$\Delta\beta=(X_{Ln}-X_{Rn})/2$--.

COLUMN 10

Line 2, "β component" should read --β components--.

COLUMN 12

Line 13, "an" should read --An--.

Signed and Sealed this

Sixth Day of February, 1990

Attest:

JEFFREY M. SAMUELS

Attesting Officer    Acting Commissioner of Patents and Trademarks